United States Patent [19]

Hall et al.

[11] Patent Number: 4,515,878
[45] Date of Patent: May 7, 1985

[54] PRINTED CIRCUIT BOARD MODIFICATION PROCESS

[75] Inventors: Douglas J. Hall, Newark Valley; Robert F. Langley, Vestal; Edwin L. Thomas, Apalachin, all of N.Y.

[73] Assignee: International Business Machines Corporation, Armonk, N.Y.

[21] Appl. No.: 587,727

[22] Filed: Mar. 8, 1984

Related U.S. Application Data

[63] Continuation of Ser. No. 412,653, Aug. 30, 1982, abandoned.

[51] Int. Cl.³ .............................................. G03F 9/00
[52] U.S. Cl. ............................................. 430/5; 430/22; 430/329; 430/331; 430/311
[58] Field of Search ................... 430/4, 5, 313, 327, 430/329, 22, 331, 311

[56] References Cited

U.S. PATENT DOCUMENTS

| | | | |
|---|---|---|---|
| 3,506,442 | 4/1970 | Kerwin | 430/22 |
| 3,649,273 | 4/1972 | Miller | 96/36.2 |
| 3,748,975 | 7/1973 | Tarabocchia | 430/5 X |
| 4,170,819 | 10/1979 | Peter et al. | 29/625 |
| 4,262,186 | 4/1981 | Provancher | 219/121 LH |
| 4,383,016 | 5/1983 | Postupack | 430/5 |

FOREIGN PATENT DOCUMENTS 1498861  1/1978  United Kingdom .

OTHER PUBLICATIONS

Couden, D. V., IBM Technical Disclosure Bulletin, vol. 2, No. 1, Jun. 1959.
IBM TDB, "Producing Accurate Photographic Plates", D. V. Couden, vol. 2, No. 1, Jun. 1959.
IBM TDB, "Altering Circuit Connections", R. R. Rodite, vol. 11, No. 8, Jan. 1969.

Primary Examiner—Roland E. Martin
Assistant Examiner—José G. Dees
Attorney, Agent, or Firm—John H. Bouchard

[57] ABSTRACT

A process is provided for modifying internal circuits in a multilayer printed circuit board by modifying the glass master which produces the internal circuit patterns. An inexpensive film copy of the glass master to be changed is used to identify the circuit lands to be removed. Holes are made in the film at these locations thereby removing the image of the land and these alterations are verified in accordance with the engineering change instructions. The perforated film is used as a template to alter the glass master by removing the emulsion through the holes in the film and then the glass master is verified and used to produce the modified circuit board.

5 Claims, 16 Drawing Figures

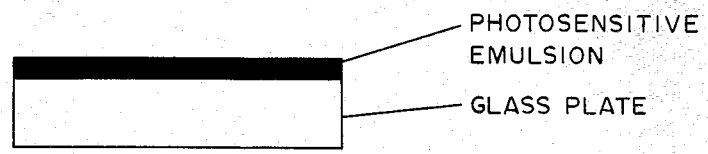
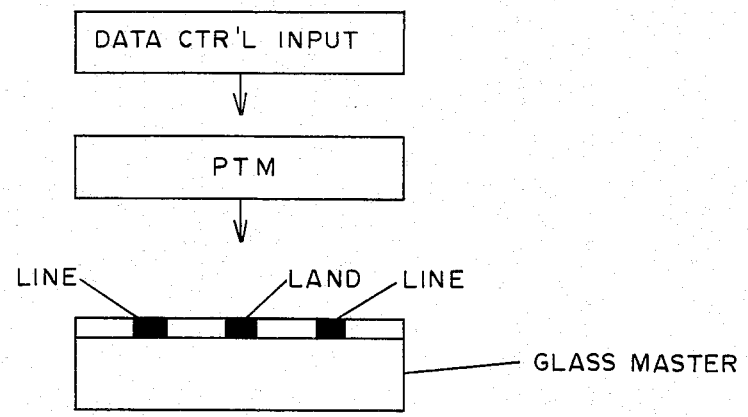
Fig. 1
Fig. 2
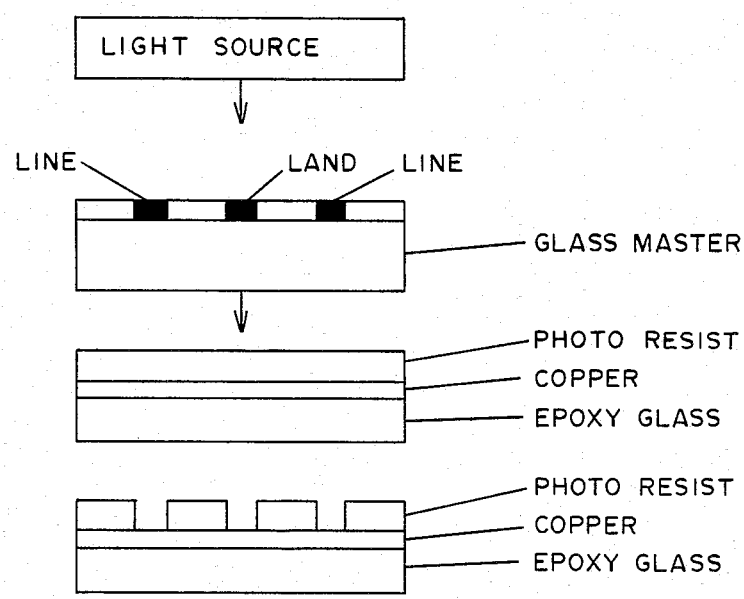
Fig. 3

APPLY COPPER ETCH
RESIST OF TIN

REMOVE PHOTO
RESIST

ETCH COPPER

REMOVE COPPER
ETCH RESIST

```
ENGINEERING
CHANGE DATA
```
Fig. 9
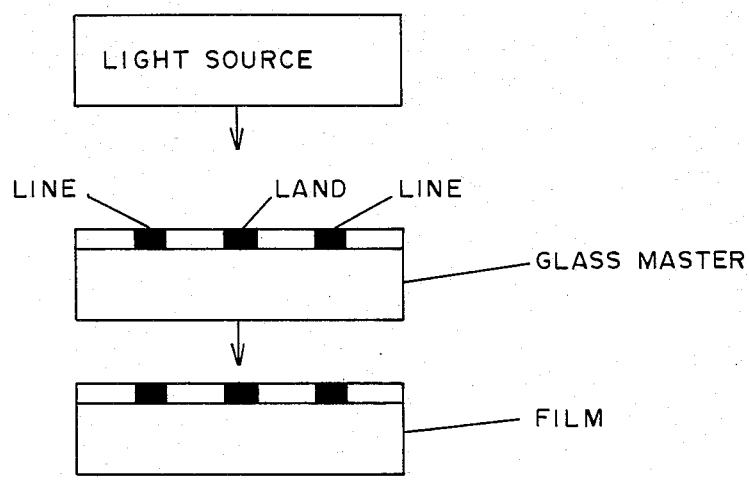
Fig. 10
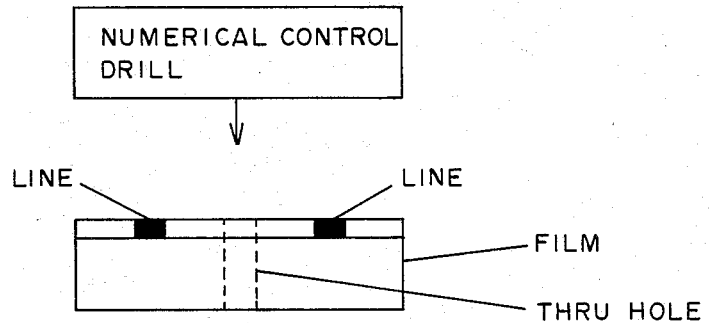
Fig. 11

PRINTED CIRCUIT BOARD MODIFICATION PROCESS

This application is a continuation, of application Ser. No. 412,653, filed 8/30/1982, abandoned.

BACKGROUND OF THE INVENTION

The making of a multilayer printed circuit board involves a number of process steps one of which is the making of a glass master which is used to expose the pattern of circuit lines and lands on the circuit board. The glass master is made by taking a photosensitized glass plate and moving it in the X and Y directions under an optical exposure head of a data controlled photo tracing machine to trace the circuit pattern on the glass plate which will correspond to the circuit pattern desired on a particular circuit board which is being processed through the production line in substantial quantity. In a multilayer board, each internal circuit plane requires its own related glass master.

It becomes necessary from time to time to modify or change the circuit patterns on the internal circuit plane of a board. Heretofore, two methods have been used to accomplish this. One method was to destroy the old glass master and make a complete new glass master. This proved to be time consuming and costly. It takes about 40 hours to process a photosensitized glass plate through the photo tracing machine. Also, there is generally a waiting period in order to obtain access to the machine which is costly in the loss of production time. The other method was to change the electrical connector in the plated through holes of the board. This connector currently takes the form of the one shown in U.S. Pat. No. 3,915,537. To make a change, this connector had to be removed, the plate hole drilled and an insulating sleeve inserted. Then, a similar connector was inserted having a longer tail which had to be wire bonded externally to a circuit land. This method was costly and presented problems.

SUMMARY OF THE INVENTION

The present invention overcomes the aforementioned problems by providing a process for modifying internal circuits in a printed circuit board by modifying the glass master which produces the internal circuit pattern. An inexpensive film copy of the glass master to be changed is used to identify the circuit lands to be removed. A numerically controlled drill forms holes in the film at these locations thereby removing the image of the land and these alterations are verified in accordance with the engineering change instructions. The perforated film is used as a template to alter the glass master by removing the emulsion through the holes in the film and then the glass master is verified and used to produce the modified circuit board.

Accordingly, a primary object of the present invention is to provide a novel and improved process for modifying the internal circuits of a multilayer printed circuit board.

Another object of the present invention is to provide a novel and improved process for modifying the internal circuits of a multilayer printed circuit board by modifying the glass master which produces the internal circuit patterns.

A still further object of the present invention is to provide a novel and improved process for modifying the internal circuits of a multilayer printed circuit board by modifying the glass master which produces the internal circuit patterns and effects the deletion of selected circuit lands thereon.

The foregoing and other objects, features and advantages of the invention will be apparent from the following more particular description of a preferred embodiment of the invention, as illustrated in the accompanying drawings.

BRIEF DESCRIPTION OF DRAWINGS

FIGS. 1-8 are schematic views illustrating various stages of a process for producing a printed circuit board.

FIGS. 9-16 are schematic views illustrating the process of the present invention for modifying the printed circuit board made by the process shown in FIGS. 1-8.

DESCRIPTION OF PREFERRED EMBODIMENT

Referring to FIG. 1, there is shown a glass plate having a photosensitive emulsion coating thereon. This emulsion coated glass plate is then processed in a data controlled photo tracing machine(PTM), as shown in FIG. 2. The desired circuit pattern is designed by product design engineering and is supplied to a suitable computer which provides the data control input. The photo tracing machine comprises briefly an optical exposure head having a light source, condensing and projection lens, and reticles for tracing a configuration, such as lines and lands on the photosensitive glass plate which moves relative to the head. An example of a photo tracing machine of this type is shown in U.S. Pat. No. 3,710,702. As is shown, the silver halide emulsion turns to black where it is exposed to the light trace and the rest of the halide remains silver. In this fashion, the desired glass master is produced.

Referring now to FIG. 3, a light source and the glass master is used to expose the circuit board having an epoxy glass base, a copper coating, and a photo resist coating over the copper. As is known, where the light passes through the glass master, i.e. the undarken area, the photoresist will become hard. The board is then chemically developed to remove the unexposed resist which leaves a pattern of exposed copper which corresponds to the emulsion pattern on the master glass.

Referring to FIGS. 4-8, there is illustrated a conventional circuitizing process for the board which will be but briefly described. Tin is electroless applied to form an etch resist for the exposed copper. The photo resist is chemically removed and all copper is etched away except that covered by the tin. Then, the tin is etched away which results in the board shown in FIG. 8 which has a pattern of copper circuit lines and lands corresponding to the emulsion pattern on the glass master, shown in FIGS. 2 and 3.

Figures 4, 5, 6, 7, 8:
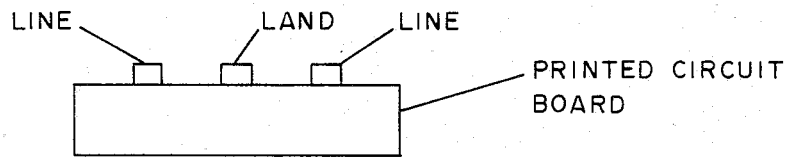

Referring to FIGS. 9-18, there is illustrated the process of the present invention for modifying or changing a printed circuit board in the production line, such as, the one shown in FIG. 8. A determination is made that the board needs a new function or that an error has to be corrected and a decision is made to meet the requirement by deleting a wire embedded in the board. As indicated in FIG. 9, computerized engineering data is generated in accordance with the change required.

Figure 12:
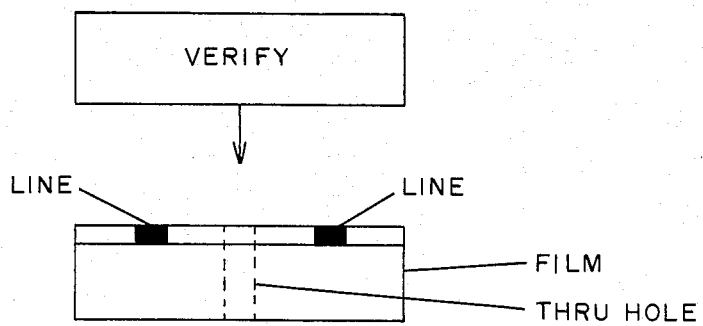

FIG. 10 shows the making of a film of the old glass master (FIGS. 2 and 3). Next, as indicated in FIG. 11, a numerically controlled mechanical drill controlled by the engineering change data is used to drill a hole through the film to remove the image of the circuit land to be deleted on the board. Following the drilling operation, the film is verified, as indicated in FIG. 12, by a numerical controlled optical inspection machine which compares the film against the engineering data to determine if the drilled location is correct.

Figure 13:
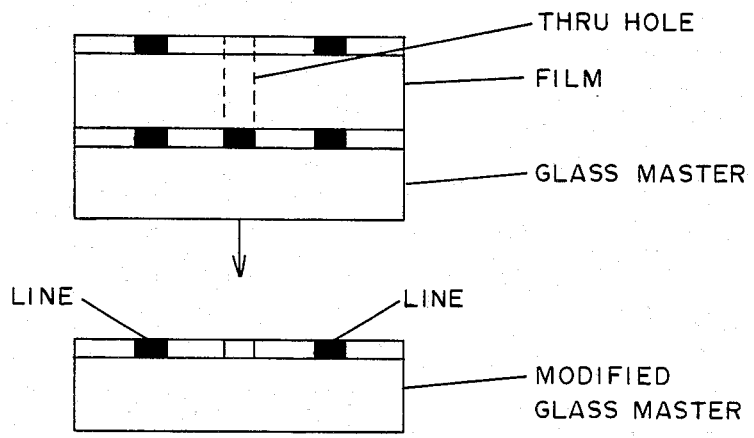

Referring now to FIG. 13, the drilled film is used as a template and it is registered over the glass master with its images in alignment with the emulsion on the glass master. The engineering change data has dictated that the emulsion representing a land and which is in alignment with the hole in the film should be removed in order to make a corresponding delete in the board. This emulsion is manually removed from the glass master by using a suitable instrument, such as, a stylus or pointed knife.

Figure 14:
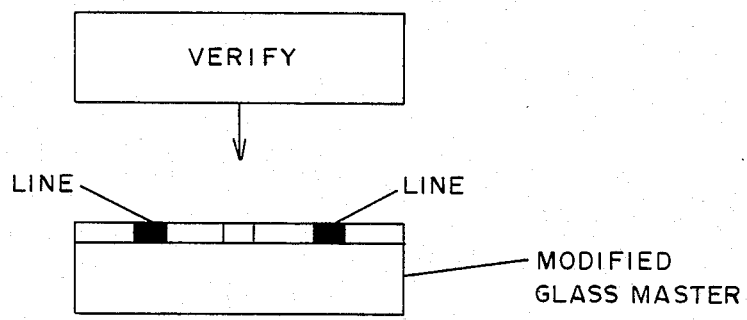

FIG. 14 indicates that the modified glass master is also verified by the numerical controlled optical inspection machine used to verify the film.

Figure 15:
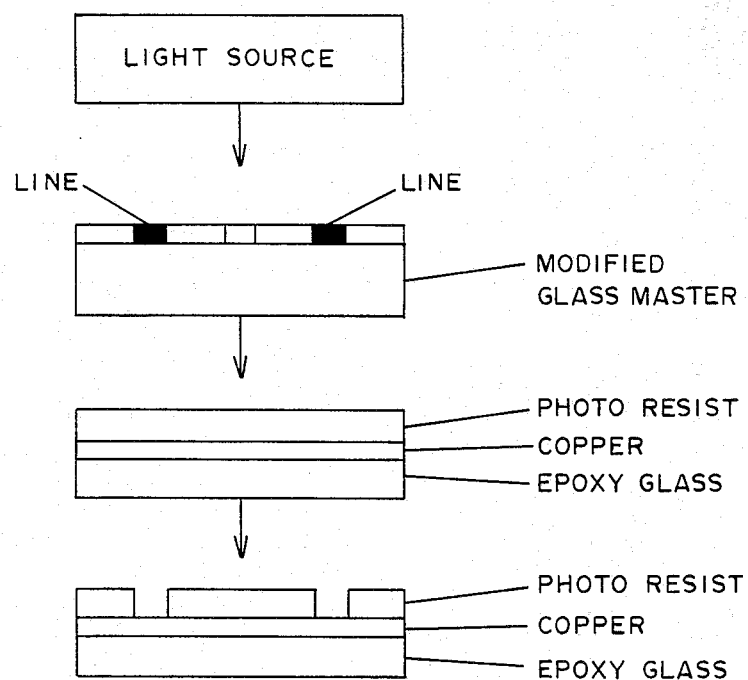

Now, as indicated in FIG. 15, the same expose and developing steps are carried out for the board as was described in connection with FIG. 3, except that now the modified glass master is used.

Figure 16:
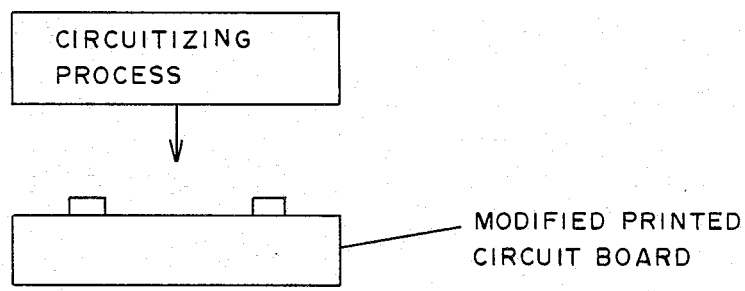

As indicated in FIG. 16, the board now is circuitized in the same manner as was described in connection with FIGS. 4–8. It will be noted that this board differs in pattern from the board shown in FIG. 8 and has been modified or changed according to engineering change instructions by the deletion of the circuit land. Although the deletion of only one circuit land has been shown for simplicity, a plurality of lands may be deleted by drilling the required holes in the film.

The present process only makes deletions. If both deletions and additions are required, two sets of engineering change instructions are used and the additions made by external twisted wire bonding.

Also, only one internal circuit plane has been shown for simplicity. It can be appreciated that in a multilayer board where there are a plurality of internal circuit planes, the use of the previously mentioned prior art methods of either making a complete new glass master for each circuit plane or changing the connectors in the plated through holes is extremely time consuming and costly. The present process wherein the old glass masters are simply altered results in a substantial reduction in time and savings in cost.

While there have been shown and described and pointed out the fundamental features of the invention as applied to the preferred embodiment, it will be understood that various omissions and substitutions and changes may be made in the form and details of the embodiment by those skilled in the art without departing from the spirit of the invention. It is the invention, therefore, to be limited only as indicated by the scope of the following claims.

What is claimed is:

1. A process for modifying at least a portion of a pattern of circuit lines and lands on a printed circuit board in accordance with engineering change data, said pattern of circuit lines and lands on said circuit board being produced from a glass master having an emulsion pattern corresponding to said circuit lines and lands, comprising the steps of:
   making a film copy of said glass master, said film copy including a complete image of said pattern of circuit lines and lands on said circuit board;
   drilling a hole through a portion to be modified of said image of said pattern of circuit lines and lands on said film copy under control of the engineering change data, said portion of said image corresponding to said portion to be modified of said emulsion pattern on said glass master;
   verifying the accuracy of the drilled hole;
   registering said film copy over said glass master with said hole in said film copy in alignment with said portion to be modified of said emulsion pattern of said glass master;
   changing said portion of said emulsion pattern on the glass master by using said hole in said film copy thereby producing a modified glass master;
   verifying the accuracy of the modified glass master; and
   using the modified glass master to produce a modified printed circuit board.

2. The process of claim 1, wherein the step of changing said portion of said emulsion pattern on the glass master comprises the steps of:
   inserting a tool through said hole in said film copy until said tool contacts said portion of said emulsion pattern on the glass master; and
   modifying said portion of said emulsion pattern on the glass master by using said tool to perform the modifying step.

3. The process of claim 2, wherein the step of modifying said portion of said emulsion pattern on the glass master further comprises the step of:
   deleting said portion of said emulsion pattern by using said tool to perform the deleting step.

4. The process of claim 1, further comprising the steps of:
   optically comparing said film copy, having said hole disposed therethrough, against the engineering change data to determine if the location of the drilled hole is correct; and
   optically comparing said modified glass master against the engineering change data to determine if the modification is correct.

5. The process of claim 3, wherein:
   said tool is a pointed knife; and
   said deleting step comprises the step of manually removing said portion of said emulsion pattern from said glass master by using said pointed knife.

* * * * *